(12) United States Patent
Tanaka

(10) Patent No.: US 6,198,653 B1
(45) Date of Patent: Mar. 6, 2001

(54) FERROELECTRIC MEMORY

(75) Inventor: Hidehiko Tanaka, Nara (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/500,847

(22) Filed: Feb. 10, 2000

(30) Foreign Application Priority Data

Feb. 19, 1999 (JP) ................................. 11-041389

(51) Int. Cl.[7] .................................................. G11C 11/22
(52) U.S. Cl. ........................ 365/145; 365/203; 365/207; 365/210
(58) Field of Search .................. 365/145, 210, 365/207, 190, 227, 203

(56) References Cited

U.S. PATENT DOCUMENTS

| | | | |
|---|---|---|---|
| 4,873,664 | 10/1989 | Eaton, Jr. ............................. | 365/145 |
| 5,615,144 | 3/1997 | Kimura et al. ....................... | 365/145 |
| 5,694,353 | * 12/1997 | Koike .................................... | 365/145 |
| 5,835,399 | * 11/1998 | Jeon ...................................... | 365/145 |
| 5,889,696 | * 3/2000 | Kawakubo et al. .................. | 365/145 |
| 5,978,250 | * 11/1999 | Chung et al. ......................... | 365/145 |
| 6,038,162 | * 3/2000 | Takata et al. ........................ | 365/145 |
| 6,094,371 | * 7/2000 | Fukuda et al. ....................... | 365/145 |

FOREIGN PATENT DOCUMENTS

| | | |
|---|---|---|
| 2-110895 | 4/1990 | (JP) . |
| 6-223583 | 8/1994 | (JP) . |
| 8-55484 | 2/1996 | (JP) . |

OTHER PUBLICATIONS

European Patent Office Search Report (EP 00301147).

* cited by examiner

Primary Examiner—Richard Elms
Assistant Examiner—Hien Nguyen
(74) Attorney, Agent, or Firm—Morrison & Foerster LLP

(57) ABSTRACT

In a ferroelectric memory, a plate line and a complementary bit line are electrically connected with each other by a MOS transistor turned on, so that a voltage of the complementary bit line amplified by a sense amplifier is transferred to the plate line. An electric current for driving the plate line flows only when the voltage of the complementary bit line is different from that of the plate line. Because the sense amplifier can drive the plate line, it is unnecessary to provide the ferroelectric memory with a plate line-driving circuit.

29 Claims, 8 Drawing Sheets

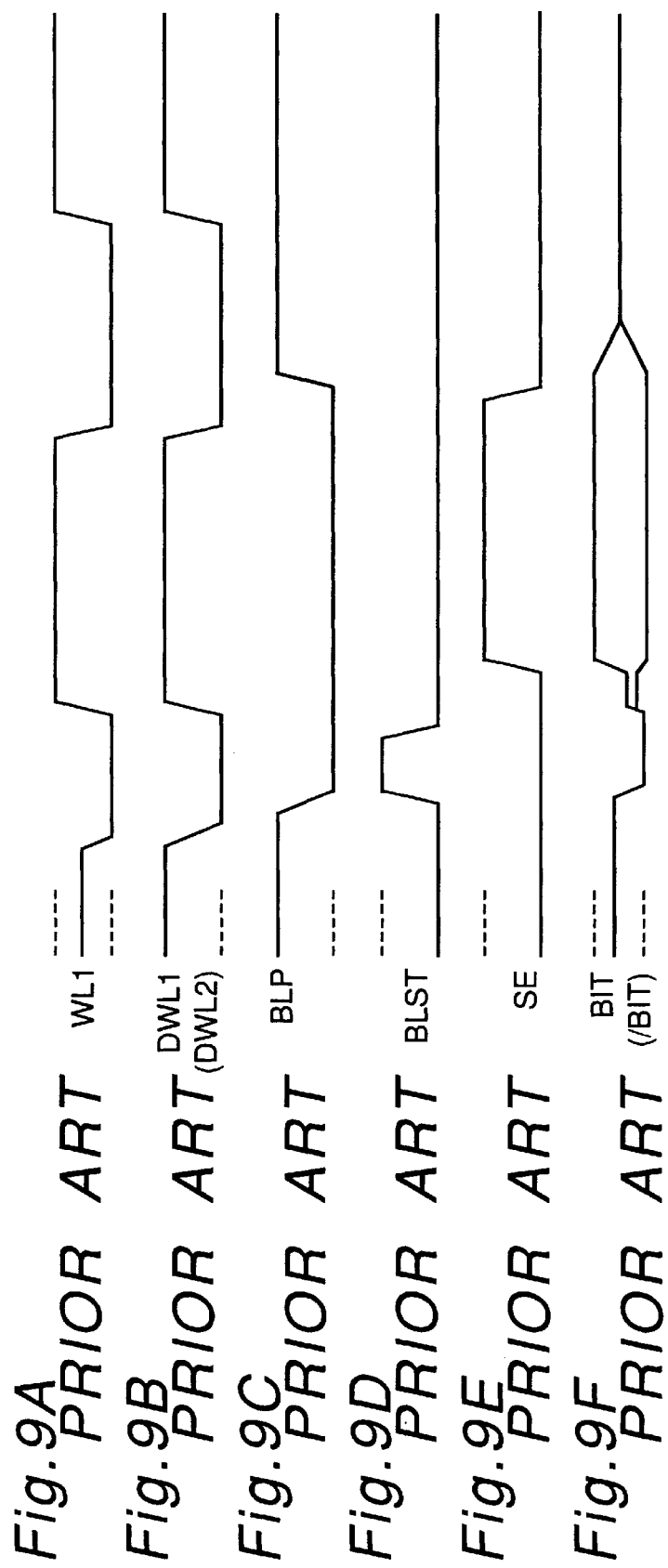

FERROELECTRIC MEMORY

BACKGROUND OF THE INVENTION

The present invention relates to a ferroelectric memory which stores information in accordance with a polarization state of a ferroelectric material interposed between electrodes of a capacitor.

A semiconductor memory using a ferroelectric material is a nonvolatile semiconductor memory storing and holding information in a polarization direction thereof. Conventional nonvolatile semiconductor memories using a ferroelectric material will be described below.

FIG. 4 shows the circuitry of a conventional semiconductor memory as disclosed in U.S. Pat. No. 4,873,664. FIGS. 5A, 5B, 5C, 5D, 5E, 5F and 5G show an operation timing of the conventional semiconductor memory of FIG. 4. FIG. 6 shows a hysteresis characteristic of a ferroelectric material used in a memory cell capacitor in the conventional semiconductor memory. FIG. 7 shows a hysteresis characteristic of a ferroelectric material used in a dummy cell capacitor in the conventional semiconductor memory.

In the circuitry of the conventional semiconductor memory of FIG. 4, a bit line (BIT) 26 and a complementary bit line (/BIT) 28 are connected with a sense amplifier 30. Memory cells 20a, 20b, and 20c and a dummy cell 46 are coupled to the bit line 26. Memory cells 20d, 20e and a dummy cell 36 are coupled to the complementary bit line 28. The memory cell 20a includes a MOS transistor 24 and a memory cell capacitor 22. The memory cell capacitor 22 includes two spaced apart plates, or electrodes, with a ferroelectric material between them. In the MOS transistor, the gate is connected with a word line 32, the drain is connected with the bit line 26, and the source is connected with a first electrode of the memory cell capacitor 22. A second electrode of the memory cell capacitor 22 is connected with a plate line 34. Similarly, the dummy cell 36 has a MOS transistor 38 and a dummy cell capacitor 40. The dummy cell capacitor 40 includes two spaced apart plates, or electrodes, with a ferroelectric material between them. The gate of the MOS transistor 38 is connected with a dummy word line 2, the drain is connected with the complementary bit line 28, and the source is connected with a first electrode of the dummy cell capacitor 40. A second electrode of the dummy cell capacitor 40 is connected with a dummy cell plate line 44. The sense amplifier 30 is activated by a sense signal SE.

The circuit operation of the circuit of the conventional nonvolatile semiconductor memory will be described below with reference to the operation timing shown in FIGS. 5A–5G, the hysteresis characteristic of the ferroelectric film of the memory cell capacitor shown in FIG. 6, and the hysteresis characteristic of the ferroelectric film of the dummy cell capacitor shown in FIG. 7.

FIGS. 6 and 7 show the hysteresis curves of the ferroelectric film. The abscissa represents the electric filed applied to the capacitor, and the ordinate represents the electric charge (polarization) corresponding to an electric field applied. Even when the electric field applied is zero, a polarization remains, that is, there exists a remanent polarization, in the ferroelectric capacitor, as shown in FIGS. 6 and 7 at points B, E, H, and K. The remanent polarization values are used to represent nonvolatile data to thereby achieve a nonvolatile semiconductor memory. When the data of the memory cell is "1", the memory cell capacitor has a state at point B of FIG. 6, whereas when the data is "0", the memory cell has a state at point E of FIG. 6.

Suppose that an initial state of the dummy cell capacitor is represented by the state at point K of FIG. 7. To read the data of the memory cell 20a, the logic voltages of the bit line 26, complementary bit line 28, word line 32, dummy word line 42, cell plate line 34, and dummy cell plate line 44 are each set to "L" (ground voltage: GND) as an initial state. Thereafter, the bit line 26 and the complementary bit line 28 are each set to a floating state. The logic voltage of the sense signal SE is set to "L" (ground voltage: GND).

Then, as shown in FIGS. 5A–5D, the word line 32, the dummy word line 42, the cell plate line 34, and the dummy cell plate line 44 are each set to a logic voltage "H". The logic voltage "H" of each of the word line 32 and the dummy word line 42 is a voltage (Vpp) obtained by boosting a supply voltage. The logic voltage "H" of each of the cell plate line 34 and the dummy cell plate line 44 is the supply voltage (Vcc). By this setting, the MOS transistor 24 of the memory cell 20a and the MOS transistor 38 of the dummy cell 36 are turned on. Thus, an electric field is applied to the memory cell capacitor 22 and the dummy cell capacitor 40. If the data of the memory cell 20a is "1" at this time, the memory cell 20a undergoes a state change from the state at point B of FIG. 6 to the state at point D. The difference Q1 between the electric charge at point B and the electric charge at point D is read as the voltage of the bit line 26. At this time, the dummy cell 36 undergoes a state change from the state at point K of FIG. 7 to the state at a point J. The difference Qd between the electric charge at point K and the electric charge at point J is read as the voltage of the complementary bit line 28. Then, the sense signal SE is set to the logic voltage "H" (supply voltage: Vcc). Thereby, the sense amplifier 30 amplifies the difference between the voltage of the bit line 26 derived from the memory cell 20a and the voltage of the complementary bit line 28 derived from the dummy cell 36. Then, the voltage of the bit line 26 is raised to the level of the supply voltage Vcc, and the voltage of the complementary bit line 28 is lowered to the level of the ground voltage GND, and data "1" of the memory cell 20a is read.

On the other hand, if the data stored in the memory cell 20a is "0", the memory cell 20a undergoes a state change from the state at point E of FIG. 7 to the state at point D. The difference Q0 between the electric charge at point E and the electric charge at point D is read as the voltage of the bit line 26. At the same time, the dummy cell 36 undergoes a state change from the state at point K of FIG. 7 to the state at point J. The difference Qd between the electric charge at point K and the electric charge at point J is read as the voltage of the complementary bit line 28. The sense amplifier 30 detects the difference between the voltage of the bit line 26 derived from the memory cell 20a and the voltage of the complementary bit line 28 derived from the dummy cell 36. Then, the sense amplifier drops the voltage of the bit line 26 to the level of the ground voltage GND, raises the voltage of the complementary bit line 28 to the level of supply voltage Vcc, and reads the data "0" of the memory cell 20a.

When the data of the memory cell 20a is "1", the amplifying operation of the sense amplifier 30 causes both the bit line 26 and the cell plate line 34 to have the supply voltage Vcc. Thereby, no electric field is applied to the memory cell capacitor 22, which then comes into the state at point E of FIG. 6. Thereafter, to restore the memory cell capacitor 22 to its original state at point B of FIG. 6, the voltage of the cell plate line 34 is set to the ground voltage to change the memory cell capacitor 22 from the state at point E of FIG. 6 to the state at point A, and then, the logic voltage of the word line 32 is set to "L". As a result, no electric field is applied to the memory cell capacitor 22. Thus, the memory cell capacitor 22 returns to the state at point B of FIG. 6. Thereby, rewriting of the data "1" to the memory cell 20a is completed. Normally, a boosted or raised voltage (Vpp) is supplied to the word line 32 so that the "H" voltage of the bit line 26 is sufficiently applied to the memory cell capacitor 22 when it is placed in the state at point A of FIG. 6.

On the other hand, when the data of the memory cell 20a is "0", the bit line 26 has the ground voltage and the cell plate line 34 has the supply voltage Vcc due to the amplifying operation of the sense amplifier 30. Therefore, the memory cell capacitor 22 has the state at point D of FIG. 6. Then, the logic voltage of the cell plate line 34 is set to "L", so that no electric field is applied to the memory cell capacitor 22. Thus, the memory cell capacitor 22 is changed from the state at point D of FIG. 6 to the state at point E. Then, the logic voltage of the word line 32 is set to "L". However, even at this time, no electric field is still applied to the memory cell capacitor 22. Thus, the memory cell capacitor 22 keeps the state at point E in FIG. 6. Thereby, rewriting of the data "0" to the memory cell 20a is completed.

When data of the memory cell 20a is "1", the complementary bit line 28 has the ground voltage, and the dummy cell plate line 44 has the supply voltage Vcc. Thus, the capacitor 40 of the dummy cell 36 has the state at point J of FIG. 7. Then, each of the dummy word line 42 and dummy cell plate line 44 is set to the ground voltage. Thus, no electric field is applied to the dummy cell capacitor 40. Thus, the dummy cell capacitor 40 returns from the state at point J to the state at point K of FIG. 7.

On the other hand, when the data of the memory cell 20a is "0", both the complementary bit line 28 and the dummy cell plate line 44 have the supply voltage Vcc. Thus, the dummy cell capacitor 40 has the state at point K of FIG. 7. Thereafter each of the dummy word line 42 and the dummy cell plate line 44 is set to the ground voltage, in which state no electric field is still applied to the dummy cell plate line 44. Thus, the dummy cell capacitor 40 keeps the state at point K of FIG. 7. In this manner, rewriting of the data "0" to the dummy cell 36 is completed.

FIG. 8 shows the circuitry of another conventional semiconductor memory in which the potential of a plate line is fixed (see, for example, Japanese Patent Application Laid-Open Nos. 2-110895 and 8-55484).

In the circuit of the semiconductor memory shown in FIG. 8, a sense amplifier 76 is connected with a bit line B and a complementary bit line /B. Memory cells MC1 and MC2 are connected with the bit line B and the complementary bit line /B, respectively. The memory cells MC1 and MC2 each have a MOS transistor T and a capacitor C. The capacitor C of the memory cell MC1 has two spaced-apart electrodes and a ferroelectric film between them. In the MOS transistor T of the memory cell MC1, its gate is connected with a word line W1, its drain is connected with the bit line B, and its source is connected with a first electrode of the associated capacitor C. A second electrode of the capacitor C is connected with a cell plate line P. Similarly, in the MOS transistor T of the memory cell MC2, its gate is connected with a word line W2, its drain is connected with the complementary bit line /B, and its source is connected with a first electrode of the associated capacitor C. A second electrode of the capacitor C of the memory cell MC2 is also connected with the cell plate line P. The sense amplifier 76 is activated by a sense signal SE.

This conventional semiconductor memory has a pre-charge circuit 70, an intermediate potential generation circuit 72, and a reference level generation circuit 74. According to a bit line pre-charge signal BLP, the pre-charge circuit 70 pre-charges the potentials of each of the bit line B and the complementary bit line /B to an intermediate level. The intermediate potential generation circuit 72 generates an intermediate potential between "H" and "L" levels of the bit line and supplies it to the plate line P and the pre-charge circuit 70. According to a bit line potential-setting signal BLST, the reference level generation circuit 74 sets the potentials of each of the bit line B and the complementary bit line /B to the ground potential level immediately before the potential of a word line (for example, W1) has a select level. Once the word line W1 has a select level, the reference level generation circuit 74 supplies a reference level to the bit line B and the complementary bit line /B on which information stored in a selected memory cell MC is read, by a dummy word line (DW1) that is placed at a select level synchronously with the word line (W1).

The read operation of this conventional nonvolatile ferroelectric memory is described below with reference also to waveform charts shown in FIGS. 9A, 9B, 9C, 9D, 9E, and 9F.

In a stand-by state, i.e., before access to the memory cell MC1 starts, the bit line B and the complementary bit line /B are pre-charged to an intermediate potential almost equal to the potential of the plate line P. Then, immediately before the potential of the word line W1 has the select level after the access starts, the bit line potential-setting signal BLST becomes active, and the bit line B and the complementary bit line /B are set to the ground potential (or supply potential). Thereafter, each of the word line W1 and the dummy word line DW1 has the select level, so that information stored in the selected memory cell MC is output to the bit line B while the reference level generation circuit 74 supplies the reference level to the complementary bit line /B. Thereafter, the sense amplifier 76 amplifies the differential potential between the bit line B and the complementary bit line /B and outputs it to the outside.

If the transistor T of the memory cell MC is placed in an off state and the first electrode (storage node) of the capacitor C is placed in a floating state in the above stand-by state, leak of an electric charge occurs between the storage node and a substrate although the amount of the leaked electric charge is slight. Therefore, the leak between the storage node and the substrate, which is normally at the ground potential level, results in drop of the potential of the storage node to a level in the vicinity of the ground potential level and inversion of a spontaneous polarization of the memory cell MC. Thus, in the conventional semiconductor memory, to prevent the inversion of the spontaneous polarization of the memory cell MC, the potential of the word line (W1 or the like) is set to a predetermined level between the select level and a non-select level to turn on the transistor T slightly. This is to allow the storage node to have an intermediate potential almost equal to the potential of the plate line P by, through the bit line B, compensating the storage node for an electric charge which has leaked to the substrate or the like.

The above two kinds of the conventional ferroelectric memories have the following problems.

First, in the first type of the conventional nonvolatile ferroelectric memory shown in FIG. 1, because the plate line is driven to have a predetermined potential for each access to a memory cell, a plate line-driving time is totally long.

Accordingly, a high-speed operation cannot be accomplished and in addition, the power consumption is large due to repeated charge and discharge of the plate line.

The second type of the conventional ferroelectric memory shown in FIG. 8 does not have such a problem because a predetermined potential is always supplied to the plate line.

However, in the second conventional ferroelectric memory, to prevent the inversion of the spontaneous polarization of the ferroelectric film of the capacitor element in the memory cell MC, the word line (e.g. W1) is set to a predetermined level between the select level and the non-select level to slightly turn on the transistor T to thereby compensate, through the bit line B, the storage node for a leaked electric charge and hold the storage node at the potential substantially equal to the plate line during the stand-by mode, as described above. Accordingly, complicated control of the potential of the word line is required, and there is also a possibility that the transistor of the memory cell is not turned on owing to a variation in quality of component parts manufactured. In this case, the leak from the storage node cannot be compensated for and the spontaneous polarization will be inverted.

SUMMARY OF THE INVENTION

Therefore, it is an object of the present invention to provide a ferroelectric memory capable of performing a reliable and high-speed operation at a low power consumption and by a comparatively simple control.

In order to accomplish the above object, the present invention provides a ferroelectric memory comprising a plurality of memory cells arranged in rows and columns, in which each memory cell has a capacitor and a transistor, the capacitor has first and second opposed electrodes and a ferroelectric film disposed between the first and second electrodes and, stores and holds binary information by a polarization state of the ferroelectric film, and one of a source and a drain of the transistor is connected with the first electrode of the capacitor, the ferroelectric memory further comprising:

a word line connected with a gate of the transistor of a memory cell;

a bit line connected with the other of the source and the drain of the transistor of the memory cell and coupled to one input of a sense amplifier;

a complementary bit line supplied with a reference voltage and coupled to the other input of the sense amplifier;

a plate line connected with the second electrode of the capacitor of the memory cell; and a switching means through which the plate line is connected with the complementary bit line, wherein with the word line being active and the memory cell selected, data is written or rewritten to this memory cell by turning on the switching means and transferring a voltage of the complementary bit line to the plate line.

According to the present invention, the voltage of the complementary bit line amplified by the sense amplifier is transferred to the plate line by connecting the plate line and the complementary bit line with each other by the switching means. In this case, an electric current for driving the plate line flows only when the voltage of the complementary bit line is different from that of the plate line. Thus, the ferroelectric memory consumes less driving electric current than that of the first conventional memory in which the cell plate line is driven every access to memory cells. Further, because the sense amplifier can drive the plate line, it is unnecessary to provide the ferroelectric memory with a plate line-driving circuit. Therefore, a high-speed operation can be accomplished at a low electric power and by a comparatively easy control.

In a stand-by state and in a state in which data is read from the memory cell, the plate line may be fixed at a predetermined potential.

In this case, a read operation can be accomplished at a higher speed than in the first conventional memory in which the cell plate line is driven for each read operation.

In a state in which the memory cell is not selected, the bit line may be maintained at a constant voltage.

In this case, unlike the second conventional memory, it is unnecessary to change the voltage level of the bit line before a read operation starts. Thus, it is possible to read polarization information out to the bit line at a high speed.

If in the stand-by state, the plate line is fixed at a ground voltage, it is possible to solve the problem inherent in the second conventional memory that leak of an electric charge from the storage node of the memory cell to the substrate or the like causes inversion of the spontaneous polarization of the ferroelectric material of the memory cell capacitor.

After writing or rewriting is executed, the bit line and the plate line may be pre-charged to a ground potential while the word line is being kept active.

In this case, the write and rewrite operations finish up by setting a voltage to be applied across the memory cell capacitor to zero volts. Therefore, a voltage that is output to the bit line in a next cycle can be generated accurately and a reliable operation can be accomplished.

The present invention also provides a ferroelectric memory comprising a plurality of memory cells and dummy cells arranged in rows and columns, in which each of the memory cells and dummy cells has a capacitor and a transistor, the capacitor has first and second opposed electrodes and a ferroelectric film disposed between the first and second electrodes and, stores and holds binary information by a polarization state of the ferroelectric film, and one of a source and a drain of the transistor is connected with the first electrode of the capacitor, the ferroelectric memory further comprising:

word lines and dummy word lines connected with gates of the transistors of the memory cells and dummy cells;

a bit line connected with the other of the source and the drain of the transistor of each of memory cells and a dummy cell and coupled to one input of a sense amplifier;

a complementary bit line connected with the other of the source and the drain of the transistor of each of memory cells and a dummy cell and coupled to the other input of the sense amplifier;

a first plate line coupled with the memory cells and dummy cell which are connected with the bit line;

a second plate line coupled with the memory cells and dummy cell which are connected with the complementary bit line;

a first switching means through which the first plate line is connected with the complementary bit line; and a second switching means through which the second plate line is connected with the bit line, wherein when a memory cell connected with the bit line has been selected, data is written or rewritten to the selected memory cell by turning on the first switching means and transferring a voltage of the complementary bit line to the first plate line, and when a memory cell connected with the complementary bit line has been selected, data is written or rewritten to the selected memory cell by turning on the second switching means and transferring a voltage of the bit line to the second plate line.

Also, the present invention provides a ferroelectric memory comprising a plurality of memory cells and dummy cells arranged in rows and columns, in which each of the memory cells and dummy cells has a capacitor and a transistor, the capacitor has first and second opposed electrodes and a ferroelectric film disposed between the first and second electrodes, and stores and holds binary information by a polarization state of the ferroelectric film, and one of a source and a drain of the transistor is connected with the first electrode of the capacitor, the ferroelectric memory further comprising:

word lines and dummy word lines connected with gates of the transistors of the memory cells and dummy cells;

a bit line connected with the other of the source and the drain of the transistor of each of memory cells and a dummy cell and coupled to one input of a sense amplifier;

a complementary bit line connected with the other of the source and the drain of the transistor of each of memory cells and a dummy cell and coupled to the other input of the sense amplifier;

a first plate line coupled with the memory cells which are connected with the bit line;

a second plate line coupled with the memory cells which are connected with the complementary bit line;

a third plate line coupled with the dummy cells which are connected with the bit line and the complementary bit line, respectively;

a first switching means through which the first plate line is connected with the complementary bit line; and a second switching means through which the second plate line is connected with the bit line, wherein the third plate line is fixed at a ground voltage, when a memory cell connected with the bit line has been selected, data is written or rewritten to the selected memory cell by turning on the first switching means and transferring a voltage of the complementary bit line to the first plate line, and when a memory cell connected with the complementary bit line has been selected, data is written or rewritten to the selected memory cell by turning on the second switching means and transferring a voltage of the bit line to the second plate line.

In each of the above two ferroelectric memories, when a memory cell connected with the bit line is selected, the voltage of the complementary bit line amplified by the sense amplifier is transferred to the first plate line, so that an electric current for driving the first plate line flows only when the voltage of the complementary bit line is different from the voltage of the first plate line. When a memory cell connected with the complementary bit line is selected, the voltage of the bit line amplified by the sense amplifier is transferred to the second plate line, so that an electric current for driving the second plate line flows only when the voltage of the bit line is different from the voltage of the second plate line. Accordingly, the ferroelectric memory uses less driving electric current than the first conventional memory. Further, because the sense amplifier drives the cell plate lines, it is unnecessary to provide the ferroelectric memory with a plate line-driving circuit.

Furthermore, the present invention provides a ferroelectric memory comprising a plurality of memory cells and dummy cells arranged in rows and columns, in which each of the memory cells and dummy cells has a capacitor and a transistor, the capacitor has first and second opposed electrodes and a ferroelectric film disposed between the first and second electrodes and, stores and holds binary information by a polarization state of the ferroelectric film, and one of a source and a drain of the transistor is connected with the first electrode of the capacitor, the ferroelectric memory further comprising:

word lines and dummy word lines connected with gates of the transistors of the memory cells and dummy cells;

a bit line connected with the other of the source and the drain of the transistor of each of memory cells and a dummy cell and coupled to one input of a sense amplifier;

a complementary bit line connected with the other of the source and the drain of the transistor of each of memory cells and a dummy cell and coupled to the other input of the sense amplifier;

a first plate line coupled with the memory cells and dummy cell which are connected with the bit line;

a second plate line coupled with the memory cells and dummy cell which are connected with the complementary bit line;

a first switching means through which the first plate line is connected with the complementary bit line; and a second switching means through which the second plate line is connected with the bit line, wherein data is written or rewritten to a memory cell by turning on the first and second switching means and transferring a voltage of the complementary bit line to the first plate line while transferring a voltage of the bit line to the second plate line.

Also, the present invention provides a ferroelectric memory comprising a plurality of memory cells and dummy cells arranged in rows and columns, in which each of the memory cells and dummy cells has a capacitor and a transistor, the capacitor has first and second opposed electrodes and a ferroelectric film disposed between the first and second electrodes and, stores and holds binary information by a polarization state of the ferroelectric film, and one of a source and a drain of the transistor is connected with the first electrode of the capacitor, the ferroelectric memory further comprising:

word lines and dummy word lines connected with gates of the transistors of the memory cells and dummy memory cells;

a bit line connected with the other of the source and the drain of the transistor of each of memory cells and a dummy cell and coupled to one input of a sense amplifier;

a complementary bit line connected with the other of the source and the drain of the transistor of each of memory cells and a dummy cell and coupled to the other input of the sense amplifier;

a first plate line coupled with the memory cells which are connected with the bit line;

a second plate line coupled with memory cells which are connected with the complementary bit line;

a third plate line coupled with the dummy cells which are connected with the bit line and the complementary bit line, respectively;

a first switching means through which the first plate line is connected with the complementary bit line; and a second switching means through which the second plate line is connected with the bit line, wherein the third plate line is fixed at a ground voltage, and data is written or rewritten to a memory cell by turning on the first and second switching means and transferring a voltage of the complementary bit line to the first plate line while transferring a voltage of the bit line to the second plate line.

In each of the above two ferroelectric memories, whether the selected memory cell is a memory cell connected with the bit line or the complementary bit line, the voltage of the complementary bit line is transferred to the first plate line, and at the same time, the voltage of the bit line is transferred to the second plate line. Thus, a simplified control can be achieved, as compared with the above case in which the transfer of the voltage to the first plate line and the second plate line is selectively performed.

An average electric current required for driving the plate line is minimized by equalizing the number of the memory cells connected with the first plate line to that of the memory cells connected with the second plate line.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 9A, 9B, 9C, 9D, 9E and 9F show the operation timing of the second conventional ferroelectric memory.

DETAILED DESCRIPTION OF THE PREFERRED EMBODIMENTS

[First Embodiment]

Figure 1:
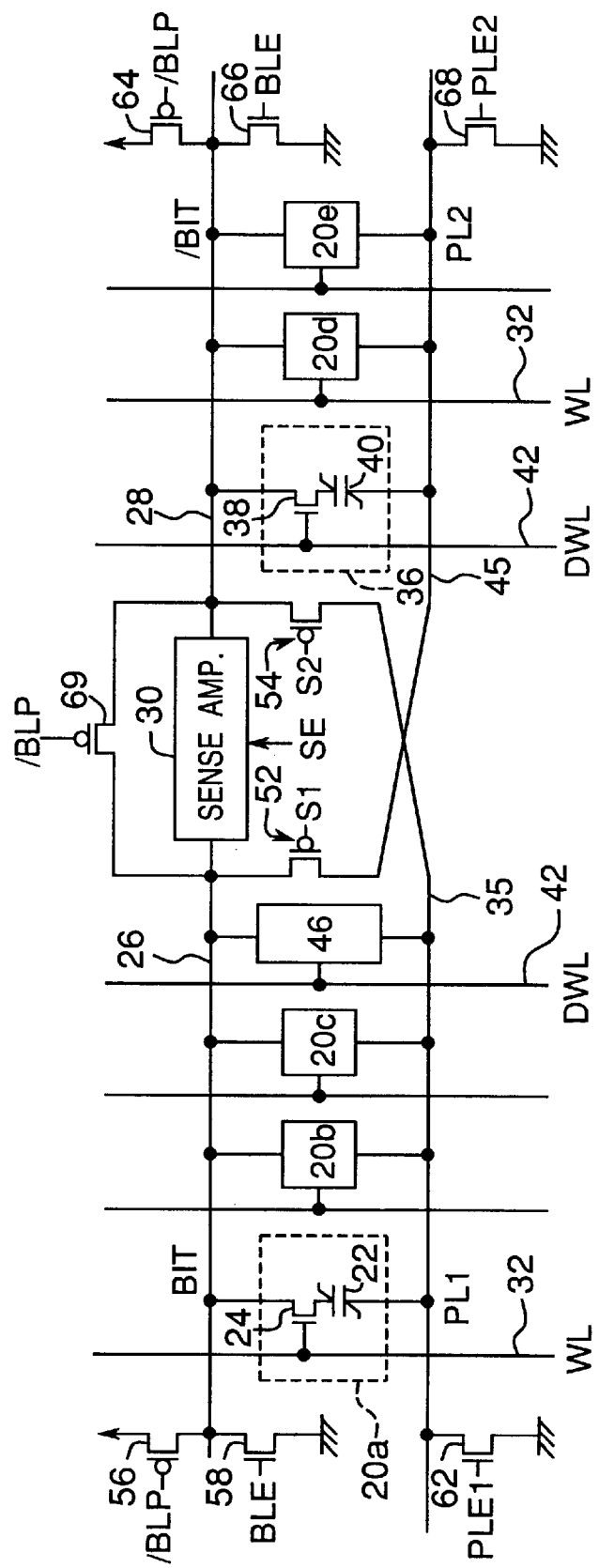
FIG. 1 shows the circuitry of a first embodiment of the ferroelectric memory of the present invention.
Figure 4:
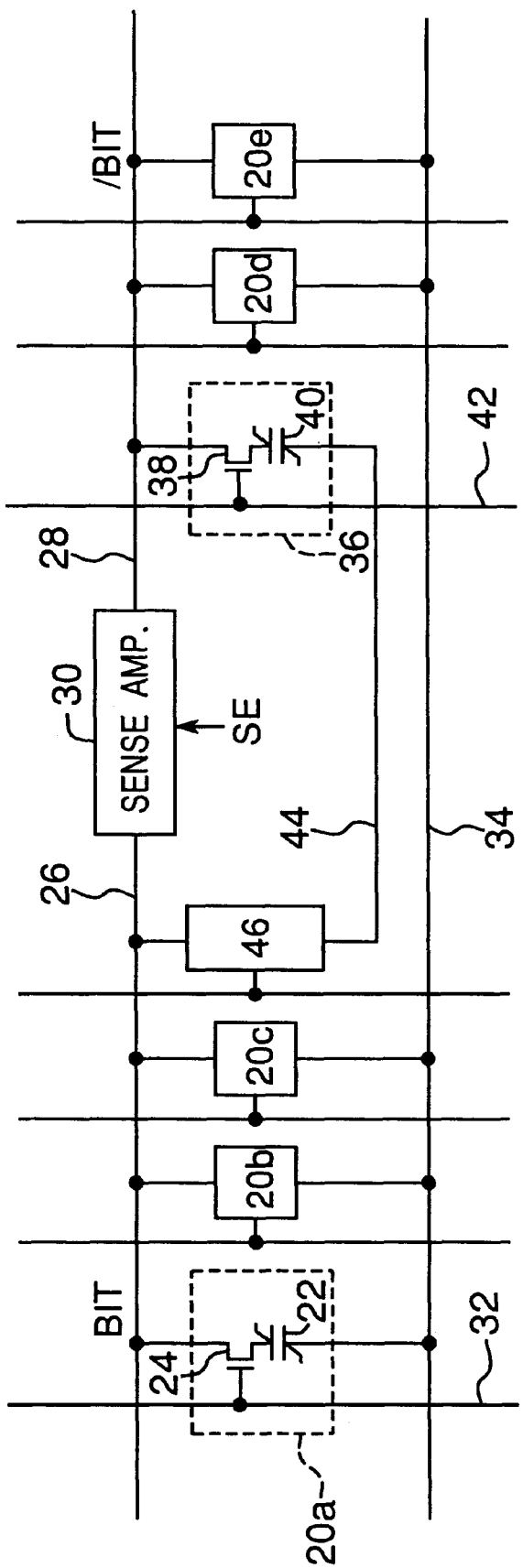
FIG. 4 shows the circuitry of a first conventional ferroelectric memory.
Figure 5:
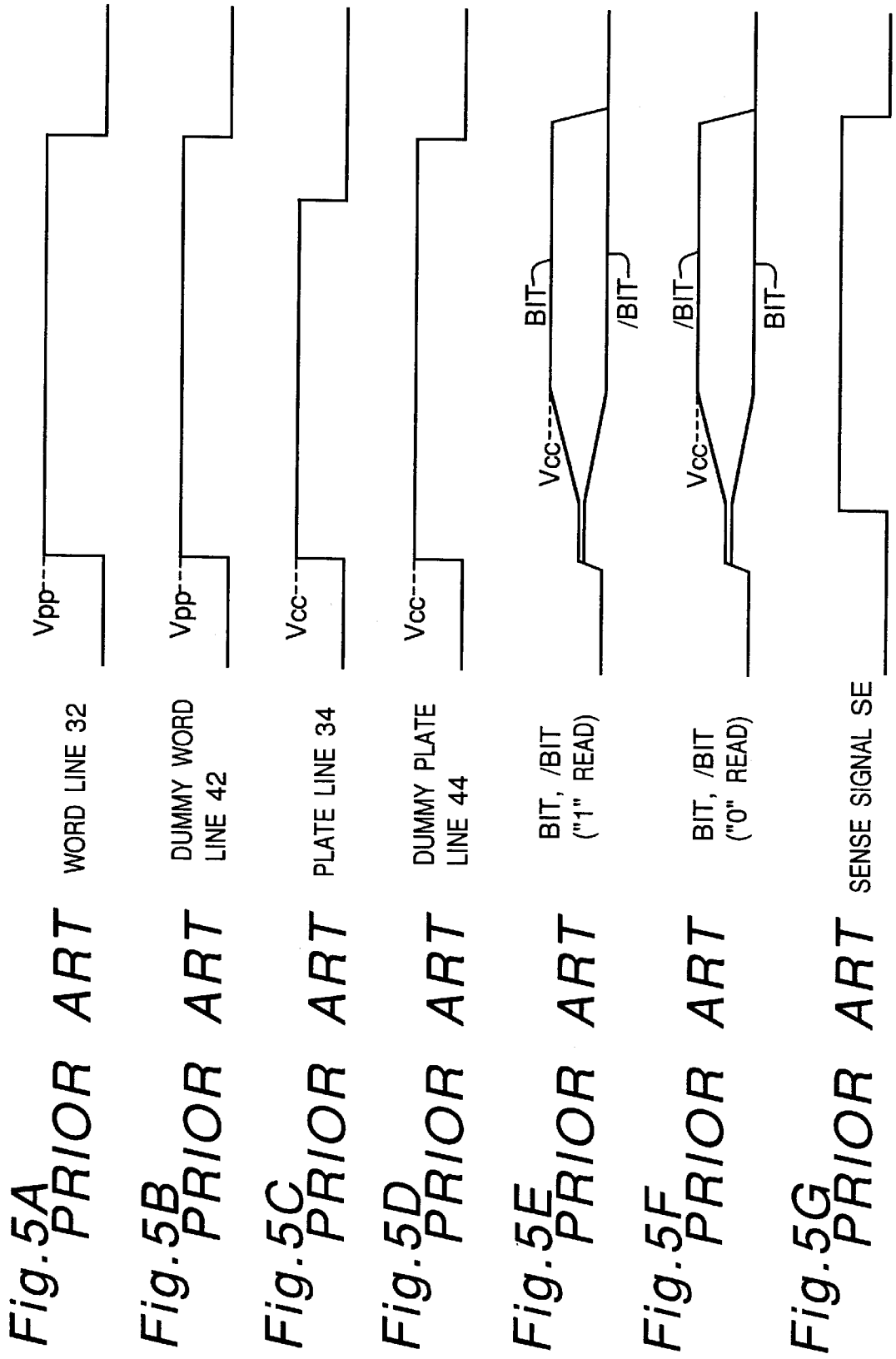
FIGS. 5A, 5B, 5C, 5D, 5E, 5F and 5G show the operation timing of the first conventional ferroelectric memory.

FIG. 1 shows the circuitry of a first embodiment of the ferroelectric memory of the present invention. In FIG. 1, parts same as or similar to the parts shown in FIG. 4 showing the circuitry of the first conventional semiconductor memory are denoted by the same reference numerals used in FIG. 4. FIGS. 2A–2L are operation timing charts of the ferroelectric memory of FIG. 1. Hysteresis curves of ferroelectric materials used in a memory cell capacitor and a dummy cell capacitor provided in the ferroelectric memory of this embodiment are similar to the hysteresis curves shown in FIGS. 6 and 7 of the ferroelectric materials used in the conventional ferroelectric memory.

Figure 6:
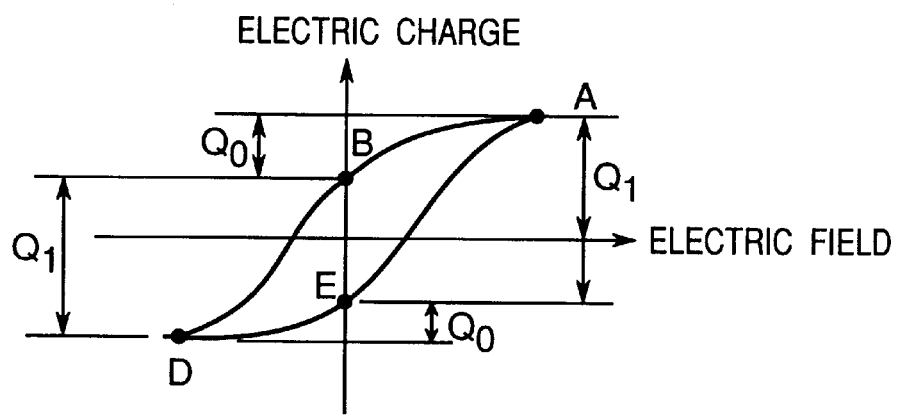
FIG. 6 shows the hysteresis characteristic of a ferroelectric material of a memory cell capacitor used in the conventional ferroelectric memory.
Figure 7:
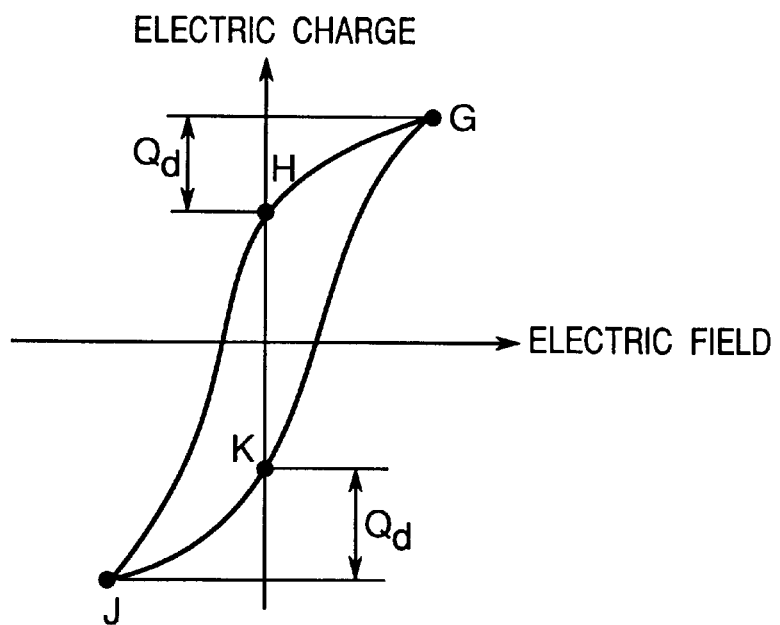
FIG. 7 shows the hysteresis characteristic of a ferroelectric material of a dummy cell capacitor used in the conventional ferroelectric memory.
Figure 8:
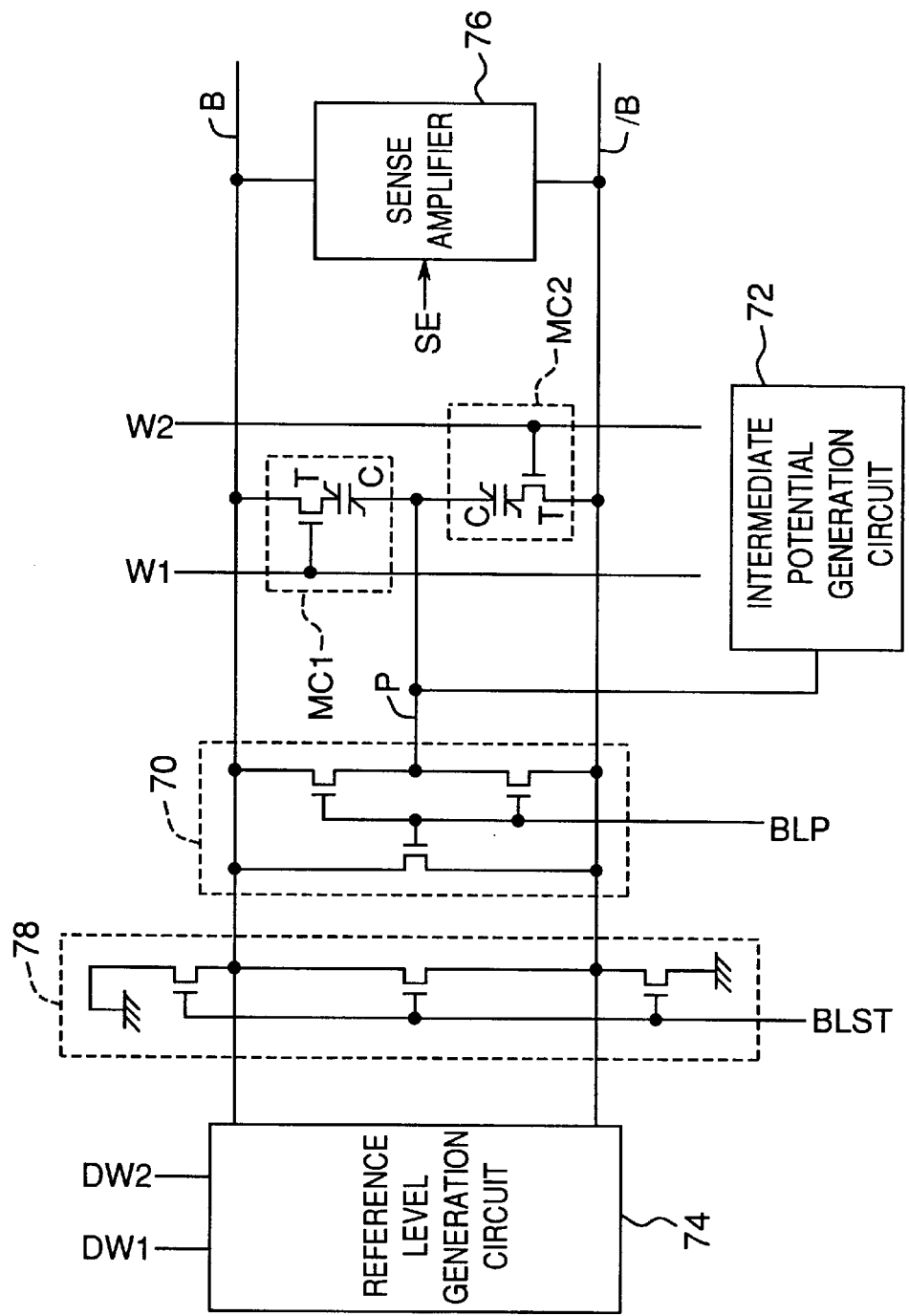
FIG. 8 shows the circuitry of a second conventional ferroelectric memory.

In this embodiment, an open bit line method using a one-transistor one-capacitor (1T1C) type memory cell is adopted and a dummy cell is connected with a complementary bit line 28. However, the present invention is not limited to this arrangement, but is applicable to any case in which a sense amplifier is coupled not only to a first bit line connected with a memory cell to be selected but also to a second bit line connected with a means for generating a reference level used to amplify a potential difference between the first bit line and the second bit line by means of the sense amplifier. Also, in the embodiment, as ferroelectric materials for memory cell capacitors and dummy cell capacitors, those that have hysteresis characteristics as shown in FIGS. 6 and 7 are used as in the conventional ferroelectric memory, although such materials are not limitative. For convenience, FIGS. 6 and 7 are also used for the description of the embodiment.

In the circuitry of the ferroelectric memory, namely a nonvolatile semiconductor memory, shown in FIG. 1, a bit line (BIT) 26 and a complementary bit line (/BIT) 28 are coupled with a sense amplifier 30. The bit line 26 is connected with associated memory cells 20a, 20b, 20c and an associated dummy cell 46. The complementary bit line 28 is connected with associated memory cells 20d, 20e and an associated dummy cell 36. Each memory cell has a MOS transistor 24 and a capacitor 22. The memory cell capacitor 22 has two electrodes and a ferroelectric material disposed between the electrodes. Similarly, each dummy cell has a MOS transistor 38 and a capacitor 40. Similarly to the memory cell capacitor 22, the dummy cell capacitor 40 has two electrodes and a ferroelectric material disposed between the electrodes. The dummy cells 36 and 46 each can function as a circuit for generating a reference voltage.

The gate of the MOS transistor 24 of each of the memory cells 20a, 20b, 20c is connected with an associated word line 32, the drain is connected with the bit line 26, and the source is connected with a first electrode of the memory cell capacitor 22. A second electrode of the memory cell capacitor 22 is connected with a cell plate line 35 (potential: PL1). Similarly, the gate of the MOS transistor 38 of the dummy memory cell 46 is connected with an associated dummy word line 42, the drain is connected with the bit line 26, and the source is connected with a first electrode of the dummy cell capacitor 40. A second electrode of the dummy cell capacitor 40 is connected with the cell plate line 35.

On the other hand, the gate of the MOS transistor 24 of each of the memory cells 20d, 20e is connected with an associated word line 32, the drain is connected with the complementary bit line 28, and the source is connected with a first electrode of the memory cell capacitor 22. A second electrode of the memory cell capacitor 22 is connected with a cell plate line 45 (potential: PL2). Similarly, the gate of the MOS transistor 38 of the dummy memory cell 36 is connected with an associated dummy word line 42, the drain is connected with the complementary bit line 28, and the source is connected with a first electrode of the dummy cell capacitor 40. A second electrode of the dummy cell capacitor 40 is connected with the cell plate line 45.

The bit line 26 and the cell plate line 45 are connected with the drain and the source of a p-channel MOS transistor 52, respectively, so that the connection between these lines 26 and 45 is controlled through the p-channel MOS transistor 52. A control signal Si is supplied to the gate of the p-channel MOS transistor 52. Similarly, the complementary bit line 28 and the cell plate line 35 are connected with the drain and source of a p-channel MOS transistor 54, so that the connection between these lines 28 and 35 is controlled through the p-channel MOS transistor 54. A control signal S2 is supplied to the gate of the p-channel MOS transistor 54.

The bit line 26 is also connected with the drains of a p-channel MOS transistor 56 and an n-channel MOS transistor 58. The complementary bit line 28 is also connected with the drains of a p-channel MOS transistor 64 and an n-channel MOS transistor 66. The sources of the p-channel MOS transistors 56 and 64 are each connected with a power source (potential: Vcc). A bit line pre-charge signal /BLP is input to the gates of the p-channel MOS transistors 56 and 64. On the other hand, the sources of the n-channel MOS transistors 58 and 66 are each connected with ground (potential: GND). A bit line initialize signal BLE is input to the gates of the n-channel MOS transistors 58 and 66.

A p-channel MOS transistor 69 is provided between the bit line 26 and the complementary bit line 28. The bit line 26 is connected with one of the drain and source of the p-channel MOS transistor 69, and the complementary bit line 28 is connected with the other of the drain and source of the p-channel MOS transistor 69. The bit line pre-charge signal /BLP is supplied to the gate of the p-channel MOS transistor 69.

Also, n-channel MOS transistors 62 and 68 are connected with the cell plate lines 35 and 45, respectively. The source of each of the n-channel MOS transistors 62 and 68 is connected with the ground potential (GND). Plate line pre-charge signals PLE1 and PLE2 are supplied to the gates of the n-channel MOS transistors 62 and 68, respectively.

The operation of the circuit of the first embodiment of the present invention will be described below using the memory cell 20a and the dummy cell 36 and with reference to the operation timing charts shown in FIGS. 2A–2L. As described previously, if the data of the memory cell 20a is "1", the memory cell capacitor 22 has a state represented at point B of FIG. 6. If the data of the memory cell 20a is "0", the memory cell capacitor 22 has a state represented at point E of FIG. 6. Suppose that the initial state of the dummy cell capacitor 40 is placed in the state at point H of FIG. 7. To read the data of the memory cell 20a, as the initial state, each of the bit line 26 and the complementary bit line 28 is pre-charged to an "H" level (supply voltage: Vcc) and equalized. To this end, both the bit line pre-charge signal /BLP and the bit line initialize signal BLE are set to a "L" level. The logic voltage of each of the word line 32, the dummy word line 42, the cell plate line 35, and the cell plate line 45 is set to a "L" level (ground voltage: GND). To this end, both the plate line pre-charge signals PLE1 and PLE2 are set to "H" level. Then, the bit line pre-charge signal /BLP is set to "H" level to place the bit line 26 and the complementary bit line 28 in a floating state.

Figure 2:
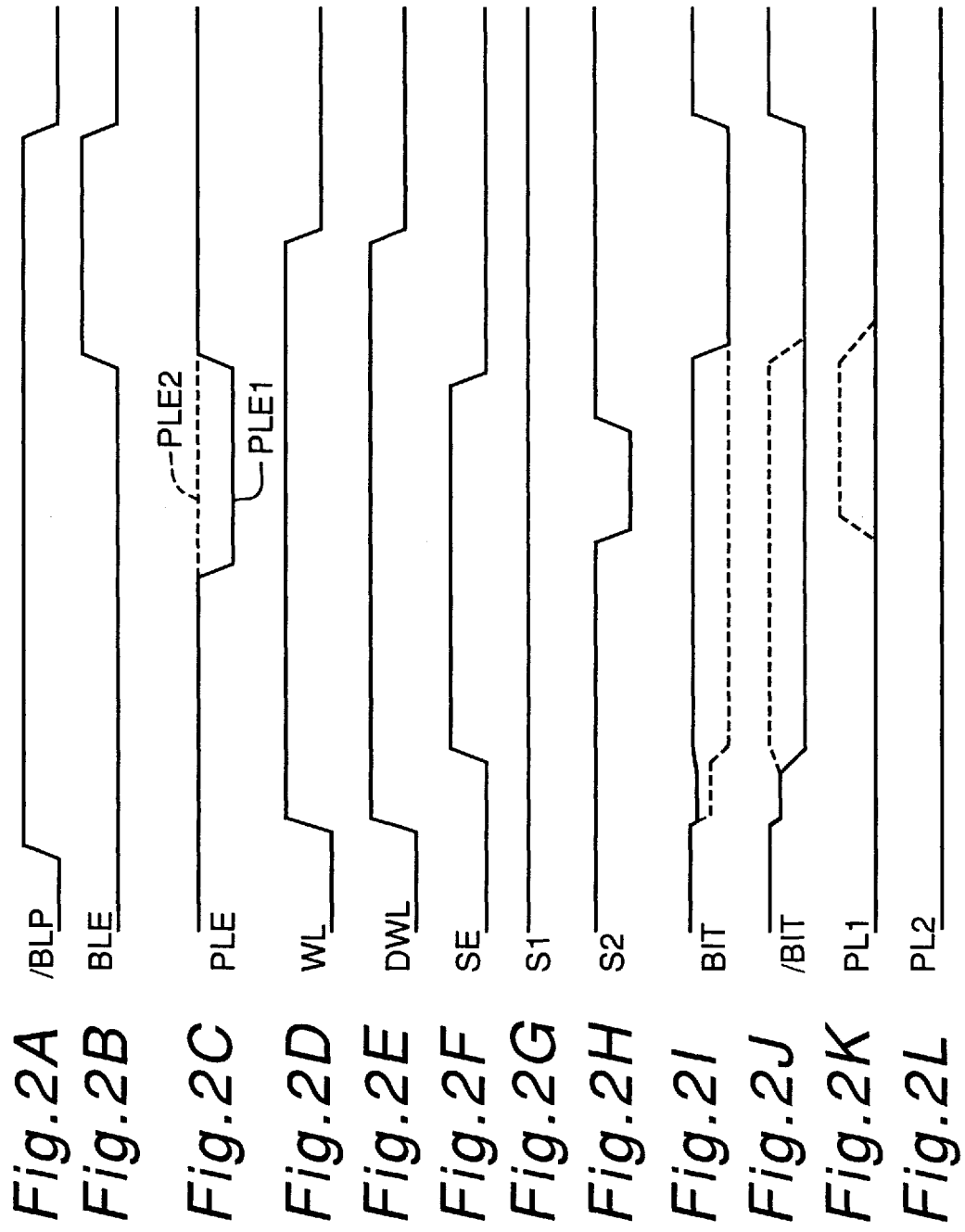
FIGS. 2A, 2B, 2C, 2D, 2E, 2F, 2G, 2H, 2I, 2J, 2K and 2L show the operation timing of the first embodiment of the ferroelectric memory.

Then, as shown in FIGS. 2D and 2E, the potential WL of the word line 32 and the potential DWL of the dummy word line 42 are each set to a logic voltage level of "H". The logic voltage "H" of each of the word line 32 and the dummy word line 42 is a voltage Vpp obtained by boosting the supply voltage Vcc. Then, the MOS transistor 24 of the memory cell 20a and the MOS transistor 38 of the dummy cell 36 are turned on, and the memory cell capacitor 22 and the dummy cell capacitor 40 are electrically connected with the bit line 26 and the complementary bit line 28, respectively. Because the interconnect capacitance of each of the bit line 26 and the complementary bit line 28 is great, the voltage of the bit lines hardly changes, and a voltage substantially equal to the supply voltage Vcc is applied to the memory cell capacitor 22 and the dummy cell capacitor 40. If the data of the memory cell 20a is "1" at this time, the memory cell capacitor 22 undergoes a state change from the state at point E shown in FIG. 6 to that at point A, and the difference Q0 between the electric charge at point B and the electric charge at point A is read as a voltage change of the bit line 26. On the other hand, if the data of the memory cell 20a is "0", the memory cell capacitor 22 undergoes a state change from the state at point E of FIG. 6 to that at point A. The difference Q1 between the electric charges at point E and at point A is read as a voltage change of the bit line 26. At this time, the dummy cell 36 changes from the state at point H of FIG. 7 to the state at point G. The difference Qd between the electric charges at point H and at point G is read as a voltage change of the complementary bit line 28. Because Q1>Qd>Q0, the voltages output to the bit line 26 become smaller in this order.

Then, the sense signal SE of the sense amplifier 30 is set to an "H" level. In response to this, the sense amplifier 30 amplifies the difference between the voltage on the bit line 26 derived from the memory cell 20a and the voltage on the complementary bit line 28 derived from the dummy cell 36.

If the data of the memory cell 20a is "1", the voltage output to the bit line 26 is greater than the voltage output to the complementary bit line 28. Therefore, the voltage of the bit line 26 rises in the direction of the supply voltage (Vcc), and the state of memory cell 20a approaches the state at point A. At this time, the voltage of the complementary bit line 28 decreases in the direction toward the ground voltage (GND), and the dummy cell 36 returns from the state at point G to the state at point H again.

If the data of the memory cell 20a is "0", the voltage output to the bit line 26 is smaller than the voltage output to the complementary bit line 28. Therefore, the voltage of the bit line 26 decreases, and the memory cell 20a changes from the state at point A to the state at point B. On the other hand, the potential of the complementary bit line 28 rises, and the state of the dummy cell 36 approaches point G. Then, the data can be transferred to a data line by turning on a column select switch (not shown) to connect the bit line and the data line to each other in a known manner. In this embodiment, the cell plate line 35 is not driven by using pulses at this time, unlike the conventional memory of the first type. Therefore, this embodiment does not have the problem that a high-speed output to the bit line is prevented by driving the cell plate line.

Then, as shown in FIG. 2C, the level of the cell plate control signal PLE1 is set to the "L" level to place the cell plate line 35 in a floating state. Thereafter, the control signal S2 is set to the "L" level, and the complementary bit line 28 and the cell plate line 35 are electrically connected with each other. As a result, if the data of the memory cell 20a is "1", the potential PL1 of the cell plate line 35 keeps the level of the ground voltage (GND), and the memory cell 20a maintains the state of point A. On the other hand, if the data of the memory cell 20a is "0", the potential PL1 of the cell plate line 35 rises to the supply voltage (Vcc), and the memory cell 20a changes from the state at point B to the state at point D. At this time, both the control signal S1 and the cell plate control signal PLE2 have the "H" level. Thus, the potential PL2 of the cell plate line 45 keeps the ground voltage (GND) level, and the dummy cell 36 maintains the state.

Then, the control signal S2 is set to "H" level, and the complementary bit line 28 and the cell plate line 35 are electrically disconnected from each other. Thereafter, the voltage of the sense signal SE of the sense amplifier 30 is set to "L" level, the bit line initialize signal BLE is set to "H" level, and the cell plate control signal PLEI is set to "H" level, whereby the bit line 26, the complementary bit line 28, and the cell plate line 35 have the ground voltage (GND). As a result, zero volts are applied across the capacitor 22 of the memory cell 20a and the capacitor 40 of the dummy cell 36. Accordingly, if the data of the memory cell 20a is "1", the memory cell 20a returns to the state at point B, and the data "1" is written thereto again. If the data of the memory cell 20a is "0", the memory cell 20a returns to the state at point E, and the data "0" is written thereto again. At this time, the dummy cell 36 returns to the original state at point H. In this manner, the initial state is rewritten in the memory cell capacitor 22 and the dummy cell capacitor 40. The writing and rewriting finish with applying of zero bolts across each of the memory cell capacitors 22 and 40. Thus, the voltage to be output to the bit line in a subsequent cycle can be generated accurately and thus a reliable operation can be accomplished.

Finally, the voltage of each of the word line 32 and the dummy word line 42 is set to the ground voltage (GND). Thus, no electric field is applied to the memory cell capacitor 22 or the dummy cell capacitor 40, and the polarization of each of these capacitors is maintained. Thereafter, each of the bit line pre-charge signal /BLP and the bit line initialize signal BLE is set to "L" level, and in preparation of a subsequent access operation, the bit line 26 and the complementary bit line 28 are set to "H" level.

In this embodiment, the cell plate lines 35 and 45 are driven to have "H" level only when the bit line 26 or the complementary bit line 28, which are electrically connected with the cell plate lines 45, 35 by the control signals S1 and S2, respectively, is amplified to "H" level by the sense amplifier 30. The cell plate lines 35 and 45 keep "L" level otherwise. Accordingly, the potential of the cell plate line changes less frequently in this embodiment than in the first type of the conventional semiconductor memory in which the potential of the cell plate changes every access to a memory cell. Thus, the ferroelectric memory of this embodiment uses less driving electric current. Further, the cell plate lines 35 and 45 keep "H" level in the stand-by state. Therefore, the ferroelectric memory of this embodiment does not have the problem, inherent in the conventional memory of the second type, that the spontaneous polarization of the ferroelectric film of the memory cell capacitor is inverted by the leak of an electric charge from the storage node to the substrate or the like.

In writing or re-writing data to the memory cells 20d, 20e connected with the complementary bit line 28, the p-channel MOS transistor 52 is turned on and the p-channel MOS transistor 54 is turned off.

In writing or re-writing data, both the p-channel MOS transistors 52 and 54 may be turned on. In this case, control can be accomplished easily.

[Second Embodiment]

Figure 3:
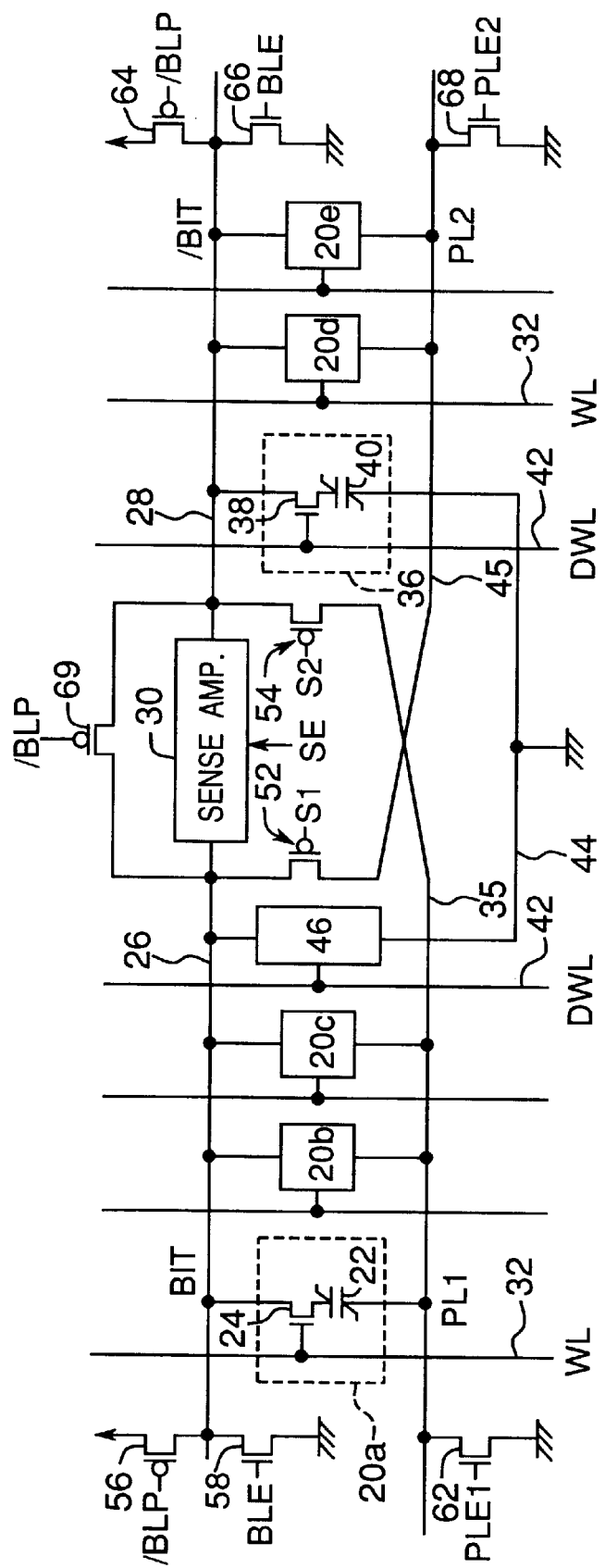
FIG. 3 shows the circuitry of a second embodiment of the ferroelectric memory of the present invention.

FIG. 3 shows a second embodiment of the ferroelectric memory of the present invention. In the second embodiment, the ferroelectric memory is provided with a dummy cell plate line 44 whose potential is fixed at the ground potential. This arrangement lowers the possibility that the spontaneous polarization of the dummy cell capacitor 40 is inverted when the cell plate line 35 or the cell plate line 45 is driven to have "H" level. That is, if the plate electrode of a dummy cell capacitor connected with an unselected dummy word line has "H" level, and the storage node of the dummy sell capacitor delays in reaching the "H" level, it is possible that the spontaneous polarization is inverted. According to the second embodiment, however, the dummy cell plate line 44 fixed at the ground potential prevents such a possibility from occurring.

In the second embodiment also, in writing or rewriting data, both the p-channel MOS transistors 52 and 54 may be turned on to simplify the control.

It is to be noted that, in the arrangements of FIGS. 1 and 3, based on the principle of geometrical mean, it is possible to minimize average electric current required for driving the cell plate lines 35 and 45 by equalizing the number of the memory cells connected with the cell plate line 35 with the number of the memory cells connected with the cell plate line 45. That is, assuming that the total number of the memory cells is N and that the number of the memory cells connected with the cell plate line 35 is N1, then, electric current required for driving the cell plate line 35 is proportional to $(N1)^2$, and electric current required for driving the cell plate line 45 is proportional to $(N-N1)^2$. Therefore, total electric current required to drive the cell plate lines 35 and 45 is proportional to $\{(N1)^2+(N-N1)^2\}$. When $N1=N/2$, $\{(N1)^2+(N-N1)^2\}=\{2(N1-N/2)^2+N^2/2\}$ is minimum.

In FIGS. 1 and 3, only one column of memory cells are shown, although actually each memory has a plurality of columns of memory cells so that the memory cells are arranged in a matrix form.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A ferroelectric memory comprising a plurality of memory cells arranged in rows and columns, in which each memory cell has a capacitor and a transistor, the capacitor has first and second opposed electrodes and a ferroelectric film disposed between the first and second electrodes and, stores and holds binary information by a polarization state of the ferroelectric film, and one of a source and a drain of the transistor is connected with the first electrode of the capacitor, the ferroelectric memory further comprising:

a word line connected with a gate of the transistor of a memory cell;

a bit line connected with the other of the source and the drain of the transistor of the memory cell and coupled to one input of a sense amplifier;

a complementary bit line supplied with a reference voltage and coupled to the other input of the sense amplifier;

a plate line connected with the second electrode of the capacitor of the memory cell; and a switching means through which the plate line is connected with the complementary bit line, wherein with the word line being active and the memory cell selected, data is written or rewritten to this memory cell by turning on the switching means and transferring a voltage of the complementary bit line to the plate line.

2. A ferroelectric memory according to claim 1, wherein in a stand-by state and in a state in which data is read from the memory cell, the plate line is fixed at a predetermined potential.

3. A ferroelectric memory according to claim 1, wherein in a state in which the memory cell is not selected, the bit line is maintained at a constant voltage.

4. A ferroelectric memory according to claim 1, wherein in a stand-by state, the plate line is fixed at a ground voltage.

5. A ferroelectric memory according to claim 1, wherein after writing or rewriting is executed, the bit line and the plate line are pre-charged to a ground potential while the word line is being kept active.

6. A ferroelectric memory comprising a plurality of memory cells and dummy cells arranged in rows and columns, in which each of the memory cells and dummy cells has a capacitor and a transistor, the capacitor has first and second opposed electrodes and a ferroelectric film disposed between the first and second electrodes and, stores and holds binary information by a polarization state of the ferroelectric film, and one of a source and a drain of the transistor is connected with the first electrode of the capacitor, the ferroelectric memory further comprising:

- word lines and dummy word lines connected with gates of the transistors of the memory cells and dummy cells;
- a bit line connected with the other of the source and the drain of the transistor of each of memory cells and a dummy cell and coupled to one input of a sense amplifier;
- a complementary bit line connected with the other of the source and the drain of the transistor of each of memory cells and a dummy cell and coupled to the other input of the sense amplifier;
- a first plate line coupled with the memory cells and dummy cell which are connected with the bit line;
- a second plate line coupled with the memory cells and dummy cell which are connected with the complementary bit line;
- a first switching means through which the first plate line is connected with the complementary bit line; and
- a second switching means through which the second plate line is connected with the bit line,
- wherein when a memory cell connected with the bit line has been selected, data is written or rewritten to the selected memory cell by turning on the first switching means and transferring a voltage of the complementary bit line to the first plate line, and
- when a memory cell connected with the complementary bit line has been selected, data is written or rewritten to the selected memory cell by turning on the second switching means and transferring a voltage of the bit line to the second plate line.

7. A ferroelectric memory according to claim 6, wherein a same number of memory cells are connected with the first plate line and the second plate line.

8. A ferroelectric memory according to claim 6, wherein in a stand-by state and in a read state, the first and second plate lines are fixed at a predetermined potential.

9. A ferroelectric memory according to claim 6, wherein in a state in which no memory cell is selected, the bit line and the complementary bit line are maintained at a constant voltage.

10. A ferroelectric memory according to claim 6, wherein in a stand-by state, the first and second plate lines are fixed at a ground voltage.

11. A ferroelectric memory according to claim 6, wherein after writing or rewriting is executed, the bit line, the complementary bit line and the first and second plate lines are pre-charged to a ground potential while the relevant word line and dummy word line are being kept active.

12. A ferroelectric memory comprising a plurality of memory cells and dummy cells arranged in rows and columns, in which each of the memory cells and dummy cells has a capacitor and a transistor, the capacitor has first and second opposed electrodes and a ferroelectric film disposed between the first and second electrodes, and stores and holds binary information by a polarization state of the ferroelectric film, and one of a source and a drain of the transistor is connected with the first electrode of the capacitor, the ferroelectric memory further comprising:

- word lines and dummy word lines connected with gates of the transistors of the memory cells and dummy cells;
- a bit line connected with the other of the source and the drain of the transistor of each of memory cells and a dummy cell and coupled to one input of a sense amplifier;
- a complementary bit line connected with the other of the source and the drain of the transistor of each of memory cells and a dummy cell and coupled to the other input of the sense amplifier;
- a first plate line coupled with the memory cells which are connected with the bit line;
- a second plate line coupled with the memory cells which are connected with the complementary bit line;
- a third plate line coupled with the dummy cells which are connected with the bit line and the complementary bit line, respectively;
- a first switching means through which the first plate line is connected with the complementary bit line; and
- a second switching means through which the second plate line is connected with the bit line,
- wherein the third plate line is fixed at a ground voltage,
- when a memory cell connected with the bit line has been selected, data is written or rewritten to the selected memory cell by turning on the first switching means and transferring a voltage of the complementary bit line to the first plate line, and
- when a memory cell connected with the complementary bit line has been selected, data is written or rewritten to the selected memory cell by turning on the second switching means and transferring a voltage of the bit line to the second plate line.

13. A ferroelectric memory according to claim 12, wherein a same number of memory cells are connected with the first plate line and the second plate line.

14. A ferroelectric memory according to claim 12, wherein in a stand-by state and in a read state, the first and second plate lines are fixed at a predetermined potential.

15. A ferroelectric memory according to claim 12, wherein in a state in which no memory cell is selected, the bit line and the complementary bit line are maintained at a constant voltage.

16. A ferroelectric memory according to claim 12, wherein in a stand-by state, the first and second plate lines are fixed at a ground voltage.

17. A ferroelectric memory according to claim 12, wherein after writing or rewriting is executed, the bit line, the complementary bit line and the first and second plate lines are pre-charged to a ground potential while the relevant word line and dummy word line are being kept active.

18. A ferroelectric memory comprising a plurality of memory cells and dummy cells arranged in rows and columns, in which each of the memory cells and dummy cells has a capacitor and a transistor, the capacitor has first and second opposed electrodes and a ferroelectric film disposed between the first and second electrodes and, stores and holds binary information by a polarization state of the ferroelectric film, and one of a source and a drain of the transistor is connected with the first electrode of the capacitor, the ferroelectric memory further comprising:

word lines and dummy word lines connected with gates of the transistors of the memory cells and dummy cells;

a bit line connected with the other of the source and the drain of the transistor of each of memory cells and a dummy cell and coupled to one input of a sense amplifier;

a complementary bit line connected with the other of the source and the drain of the transistor of each of memory cells and a dummy cell and coupled to the other input of the sense amplifier;

a first plate line coupled with the memory cells and dummy cell which are connected with the bit line;

a second plate line coupled with the memory cells and dummy cell which are connected with the complementary bit line;

a first switching means through which the first plate line is connected with the complementary bit line; and a second switching means through which the second plate line is connected with the bit line, wherein data is written or rewritten to a memory cell by turning on the first and second switching means and transferring a voltage of the complementary bit line to the first plate line while transferring a voltage of the bit line to the second plate line.

19. A ferroelectric memory according to claim 18, wherein a same number of memory cells are connected with the first plate line and the second plate line.

20. A ferroelectric memory according to claim 18, wherein in a stand-by state and in a read state, the first and second plate lines are fixed at a predetermined potential.

21. A ferroelectric memory according to claim 18, wherein in a state in which no memory cell is selected, the bit line and the complementary bit line are maintained at a constant voltage.

22. A ferroelectric memory according to claim 18, wherein in a stand-by state, the first and second plate lines are fixed at a ground voltage.

23. A ferroelectric memory according to claim 18, wherein after writing or rewriting is executed, the bit line, the complementary bit line and the first and second plate lines are pre-charged to a ground potential while the relevant word line and dummy word line are being kept active.

24. A ferroelectric memory comprising a plurality of memory cells and dummy cells arranged in rows and columns, in which each of the memory cells and dummy cells has a capacitor and a transistor, the capacitor has first and second opposed electrodes and a ferroelectric film disposed between the first and second electrodes and, stores and holds binary information by a polarization state of the ferroelectric film, and one of a source and a drain of the transistor is connected with the first electrode of the capacitor, the ferroelectric memory further comprising:

word lines and dummy word lines connected with gates of the transistors of the memory cells and dummy memory cells;

a bit line connected with the other of the source and the drain of the transistor of each of memory cells and a dummy cell and coupled to one input of a sense amplifier;

a complementary bit line connected with the other of the source and the drain of the transistor of each of memory cells and a dummy cell and coupled to the other input of the sense amplifier;

a first plate line coupled with the memory cells which are connected with the bit line;

a second plate line coupled with memory cells which are connected with the complementary bit line;

a third plate line coupled with the dummy cells which are connected with the bit line and the complementary bit line, respectively;

a first switching means through which the first plate line is connected with the complementary bit line; and a second switching means through which the second plate line is connected with the bit line, wherein the third plate line is fixed at a ground voltage, and data is written or rewritten to a memory cell by turning on the first and second switching means and transferring a voltage of the complementary bit line to the first plate line while transferring a voltage of the bit line to the second plate line.

25. A ferroelectric memory according to claim 24, wherein a same number of memory cells are connected with the first plate line and the second plate line.

26. A ferroelectric memory according to claim 24, wherein in a stand-by state and in a read state, the first and second plate lines are fixed at a predetermined potential.

27. A ferroelectric memory according to claim 24, wherein in a state in which no memory cell is selected, the bit line and the complementary bit line are maintained at a constant voltage.

28. A ferroelectric memory according to claim 24, wherein in a stand-by state, the first and second plate lines are fixed at a ground voltage.

29. A ferroelectric memory according to claim 24, wherein after writing or rewriting is executed, the bit line, the complementary bit line and the first and second plate lines are pre-charged to a ground potential while the relevant word line and dummy word line are being kept active.

* * * * *